(12) United States Patent
Li et al.

(10) Patent No.: US 10,884,468 B2
(45) Date of Patent: Jan. 5, 2021

(54) POWER ALLOCATION AMONG COMPUTING DEVICES

(71) Applicant: Lenovo Enterprise Solutions (Singapore) Pte. Ltd., Singapore (SG)

(72) Inventors: Da Li, Shanghai (CN); Shunrong Hu, Shanghai (CN); Sheng Yan Xing, Shanghai (CN)

(73) Assignee: Lenovo Enterprise Solutions (Singapore) Pte. Ltd., Singapore (SG)

(*) Notice: Subject to any disclaimer, the term of this patent is extended or adjusted under 35 U.S.C. 154(b) by 160 days.

(21) Appl. No.: 16/052,084

(22) Filed: Aug. 1, 2018

(65) Prior Publication Data

US 2019/0041937 A1    Feb. 7, 2019

(30) Foreign Application Priority Data

Aug. 2, 2017    (CN) .......................... 2017 1 0653059

(51) Int. Cl.
| | |
|---|---|
| *G06F 1/28* | (2006.01) |
| *G06F 11/30* | (2006.01) |
| *G01R 21/133* | (2006.01) |
| *G06F 1/26* | (2006.01) |

(52) U.S. Cl.
CPC ........... *G06F 1/28* (2013.01); *G01R 21/1338* (2013.01); *G06F 1/26* (2013.01); *G06F 11/3062* (2013.01)

(58) Field of Classification Search
CPC ........................................................ G06F 1/28
See application file for complete search history.

(56) References Cited

U.S. PATENT DOCUMENTS

| | | | |
|---|---|---|---|
| 8,843,772 B2 * | 9/2014 | Hormuth ................... | G06F 1/28 |
| | | | 713/300 |
| 9,250,684 B1 * | 2/2016 | Chen ...................... | G06F 1/3206 |
| 9,415,585 B1 * | 8/2016 | Goyen ................. | B41J 2/04548 |

* cited by examiner

*Primary Examiner* — Kim Huynh
*Assistant Examiner* — Eric Chang
(74) *Attorney, Agent, or Firm* — Jeffrey Streets

(57) ABSTRACT

A method, apparatus and computer program are provided for allocating power amount a plurality of computing devices. The method includes determining a current power capping amount for each of a plurality of computing devices and obtaining a current power usage of each computing device. The method further includes determining, for each computing device, an updated power capping amount based on whether or not the current power usage of the computing device has reached the current power capping amount of the computing device during a current period of time. The updated power capping amount is allocated to the respective computing devices, and a power supply is caused to deliver power to each computing device in an amount up to the updated power capping amount that has been allocated to the respective computing device.

4 Claims, 7 Drawing Sheets

POWER ALLOCATION AMONG COMPUTING DEVICES

CROSS-REFERENCE TO RELATED APPLICATIONS

This application claims priority under 35 U.S.C. § 119 to Chinese Patent Application No. 201710653059.4 filed Aug. 2, 2017, the entire text of which is specifically incorporated by reference herein.

BACKGROUND

The present disclosure relates generally to power management in electronic systems and, in particular, relates to power allocation in computer systems.

BACKGROUND OF THE RELATED ART

Computer systems, such as data centers, are often composed of multiple loads, such as servers, network switches and other types of devices. A power source provides power to such devices during operation. In an insufficient power environment in a data center, for example in cases where a portion of the power supply units fail, the load will experience a shortage of power. This shortage of power results in at least some devices being forced to shut down or being supplied with reduced power to deal with the power shortage problem. Performance of the data center operation will be degraded accordingly.

BRIEF SUMMARY

One embodiment provides a method comprising determining a current power capping amount for each of a plurality of computing devices and obtaining a current power usage of each computing device. The method further comprises determining, for each computing device, an updated power capping amount based on whether or not the current power usage of the computing device has reached the current power capping amount of the computing device during a current period of time. The updated power capping amount is allocated to the respective computing devices, and a power supply is caused to deliver power to each computing device in an amount up to the updated power capping amount that has been allocated to the respective computing device.

Another embodiment provides a computer program product comprising computer readable storage media that is not a transitory signal having program instructions embodied therewith. The program instructions executable by a processor to: determine a current power capping amount for each of a plurality of computing devices; obtain a current power usage of each computing device; determine, for each computing device, an updated power capping amount based on whether or not the current power usage of the computing device has reached the current power capping amount of the computing device during a current period of time; allocate the updated power capping amount to the respective computing devices; and cause a power supply to deliver power to each computing device in an amount up to the updated power capping amount that has been allocated to the respective computing device.

Yet another embodiment provides an apparatus comprising at least one storage device for storing program instructions and at least one processor for processing the program instructions to: determine a current power capping amount for each of a plurality of computing devices; obtain a current power usage of each computing device; determine, for each computing device, an updated power capping amount based on whether or not the current power usage of the computing device has reached the current power capping amount of the computing device during a current period of time; allocate the updated power capping amount to the respective computing devices; and cause a power supply to deliver power to each computing device in an amount up to the updated power capping amount that has been allocated to the respective computing device.

DETAILED DESCRIPTION

Figure 1:
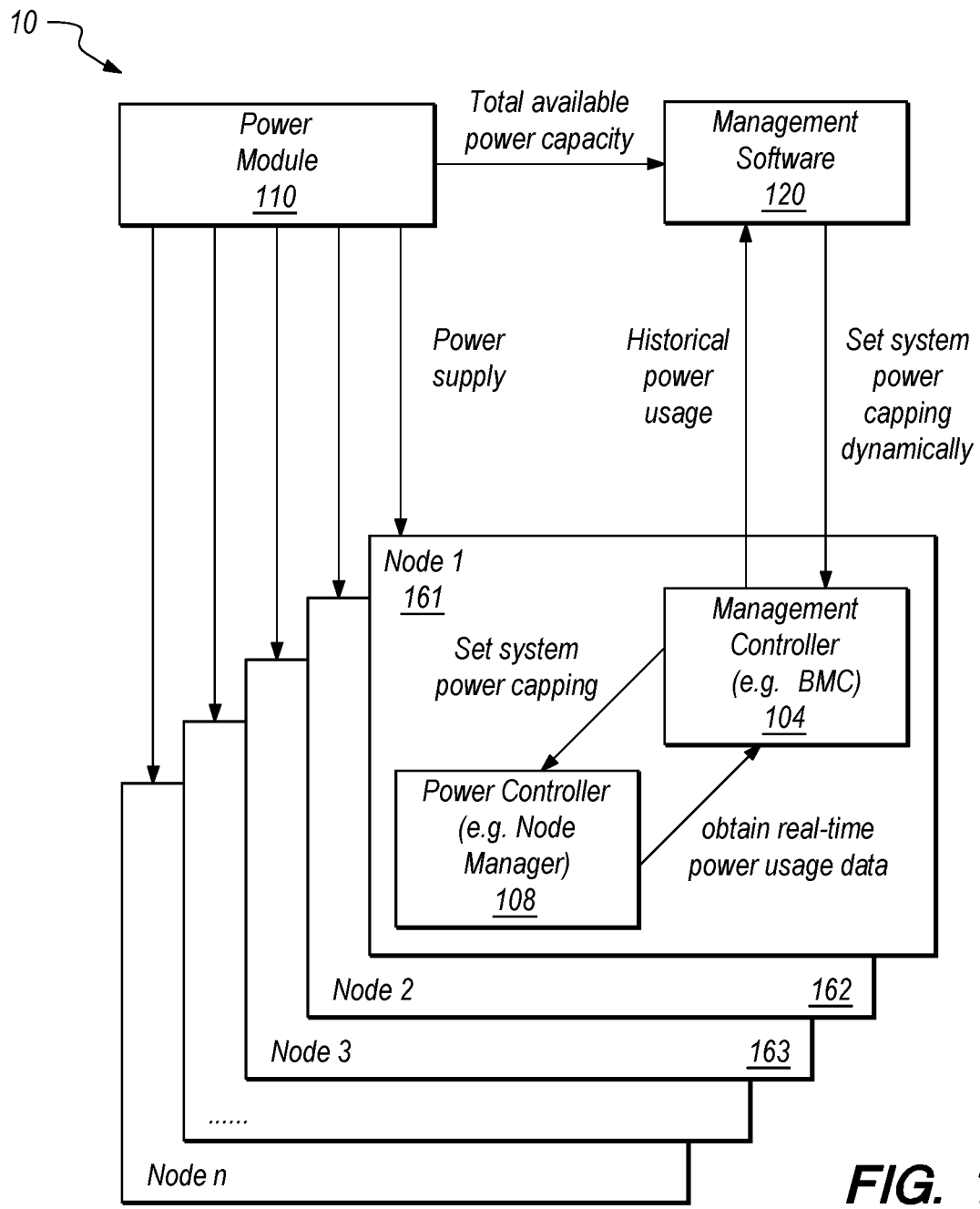
FIG. 1 is a block diagram illustrating an exemplary system for managing power allocation of a data center.

One embodiment provides a method comprising determining a current power capping amount for each of a plurality of computing devices and obtaining a current power usage of each computing device. The method further comprises determining, for each computing device, an updated power capping amount based on whether or not the current power usage of the computing device has reached the current power capping amount of the computing device during a current period of time. The updated power capping amount is allocated to the respective computing devices, and a power supply is caused to deliver power to each computing device in an amount up to the updated power capping amount that has been allocated to the respective computing device.

In one non-limiting embodiment, the plurality of computing devices includes a first computing device and a second computing device. The step of determining, for each computing device, an updated power capping amount may further comprise determining, for the first computing device, a first difference between the current power usage of the first computing device and the current power capping amount of the first computing device; and determining, for a second computing device, a second difference between the current power usage of the second computing device and the current power capping amount for the second computing device. In response to the first difference being greater than the second difference, the updated power capping amount for the first computing device is determined to be lower than the current power capping amount for the first computing device and the updated power capping amount for the second computing device is determined to be higher than the current power capping amount for the second computing device.

In another embodiment of the method, the updated power capping amount may be determined to be lower than the current power capping amount for a computing device in response to the current power usage not hitting the current power capping amount allocated to the computing device during the current time period. Furthermore, the updated power capping amount may be determined to be higher than the current power capping amount for a computing device in response to the current power usage hitting the current power capping amount allocated to the computing device during the current time period.

In one option, the updated power capping amount is determined to be higher than the current power capping amount for a computing device in response to the current power usage hitting the current power capping amount allocated to the computing device at least a threshold number of times during the current time period. In another option, the power capping amounts are increased or decreased by the predetermined incremental amount.

For example, the step of determining, for each computing device, an updated power capping amount may comprise determining, for each computing device having a current power usage that hit the current power capping amount the greatest number of times among the plurality of computing device during the current time period, the updated power capping amount to be a predetermined incremental increase above the current power capping amount for the computing device. In another option, the step of determining, for each computing device, an updated power capping amount may further comprise: determining a number of the computing devices having an updated power capping amount that is being incrementally increased; identifying an equal number of other computing devices having a current power usage that has not hit the current power capping amount during the current time period; and determining, for each of the identified computing devices, an updated power capping amount that is a predetermined incremental decrease below the current power capping amount of the identified computing device. It should be recognized that the updated power capping amount may be determined to be the same as the current power capping amount for at least one of the computing devices having a current power usage that is less than the current power capping amount allocated to the at least one computing device.

In a further embodiment of the method, the current power capping amount for each computing device may be calculated according to the formula:

$$P\_allo = (P\_node\_his/P\_total)*(P\_avail - P\_min*N\_power\_off)$$

where:
P_allo denotes the current power capping amount for allocating to a computing device;
P_node_his denotes a power usage amount of the computing device in a most-recent past time frame or cycle;
P_total denotes a total power usage amount of all of the computing devices in the most-recent past time frame or cycle;
P_avail denotes a total available power amount of the power supply unit(s) in a current time frame;
P_min denotes a minimum amount of power that each computing device needs to power on; and
N_power_off denotes the number of computing devices in a power off state in the most-recent past time frame or cycle.

A current power capping amount for each computing device may be determined based on an amount of historical power usage of each computing device and a total power supply capacity. For each computing device having a historical power usage that is zero, the updated power capping amount is the same as the current power capping amount.

In a further embodiment of the method, each computing device may have a priority value assigned thereto, wherein the updated power capping amount allocated to computing devices with a higher priority value is greater than the updated power capping amount allocated to computing devices with a lower priority value.

In a still further embodiment of the method, the updated power capping amount may be determined to be lower than or the same as the current power capping amount for a computing device whose current power usage is less than the current power capping amount allocated to the computing device, and wherein the updated power capping amount may be determined to be higher than the current power capping amount for a computing device whose current power usage hits the current power capping amount allocated to the computing device.

Another embodiment provides a computer program product comprising computer readable storage media that is not a transitory signal having program instructions embodied therewith. The program instructions executable by a processor to: determine a current power capping amount for each of a plurality of computing devices; obtain a current power usage of each computing device; determine, for each computing device, an updated power capping amount based on whether or not the current power usage of the computing device has reached the current power capping amount of the computing device during a current period of time; allocate the updated power capping amount to the respective computing devices; and cause a power supply to deliver power to each computing device in an amount up to the updated power capping amount that has been allocated to the respective computing device. The foregoing computer program product may further include program instructions for implementing or initiating any one or more aspects of the methods described herein. Accordingly, a separate description of the methods will not be duplicated in the context of a computer program product.

Yet another embodiment provides an apparatus comprising at least one storage device for storing program instructions and at least one processor for processing the program instructions to: determine a current power capping amount for each of a plurality of computing devices; obtain a current power usage of each computing device; determine, for each computing device, an updated power capping amount based on whether or not the current power usage of the computing device has reached the current power capping amount of the computing device during a current period of time; allocate the updated power capping amount to the respective computing devices; and cause a power supply to deliver power to each computing device in an amount up to the updated power capping amount that has been allocated to the respective computing device. The foregoing apparatus may further process the program instructions to implement or initiate any one or more aspects of the methods described herein.

FIG. 1 illustrates a system 10 for power allocation in a computing system, such as a data center. The system 10 represents an exemplary environment in which management software 120 may operate to manage power allocation in accordance with the embodiments hereinafter described. For example, the system 10 implements a method by which a system administrator is able to configure power allocation operation in a data center or at a node using the management software 120.

In some implementations, the system 10 includes a power source (such as a power module 110), management software 120 and a plurality of computing devices, where the computing devices may be nodes 161, 162, 163, etc. coupled to the power module 110 and the management software 120. Each node, e.g. node 161, includes a management controller 104 and a power controller 108 that is coupled to the management controller 104. The power module 110 provides power to each of the nodes. For each node, the management controller 104 is configured to obtain real-time power usage data of the node from the power controller 108, and to provide the real-time power usage data to the management software 120 as historical power usage data. The management software 120 determines, for each node, a current power capping amount based on the historical power usage data and a total amount of available power capacity, wherein the total amount of available power capacity is information obtained from the power module 110. The management software 120 may then allocate, for each node, the determined current power capping amount. Furthermore, the management software 120 may determine, for each node, an updated power capping amount based on the current power capping amount and current power usage data, and allocate the updated power capping amount to the node.

In certain embodiments, the real-time power usage data of one of the nodes may include a total measured amount of power being used by the node at any point in time. The historical power usage data of one of the nodes may include a history or log of the real-time power usage data, such as a history or log of the total measured amount of power being used by the node over a period of time. It should be recognized that the historical power usage data may include a collection of real-time power measurements of the node or may include some mathematical representation of the real-time power measurements over a relevant period of time, such as a moving average of the real-time power measurements or the peak power measurement during the relevant period of time. Power may, for example, be measured in watts (W).

Figure 2:
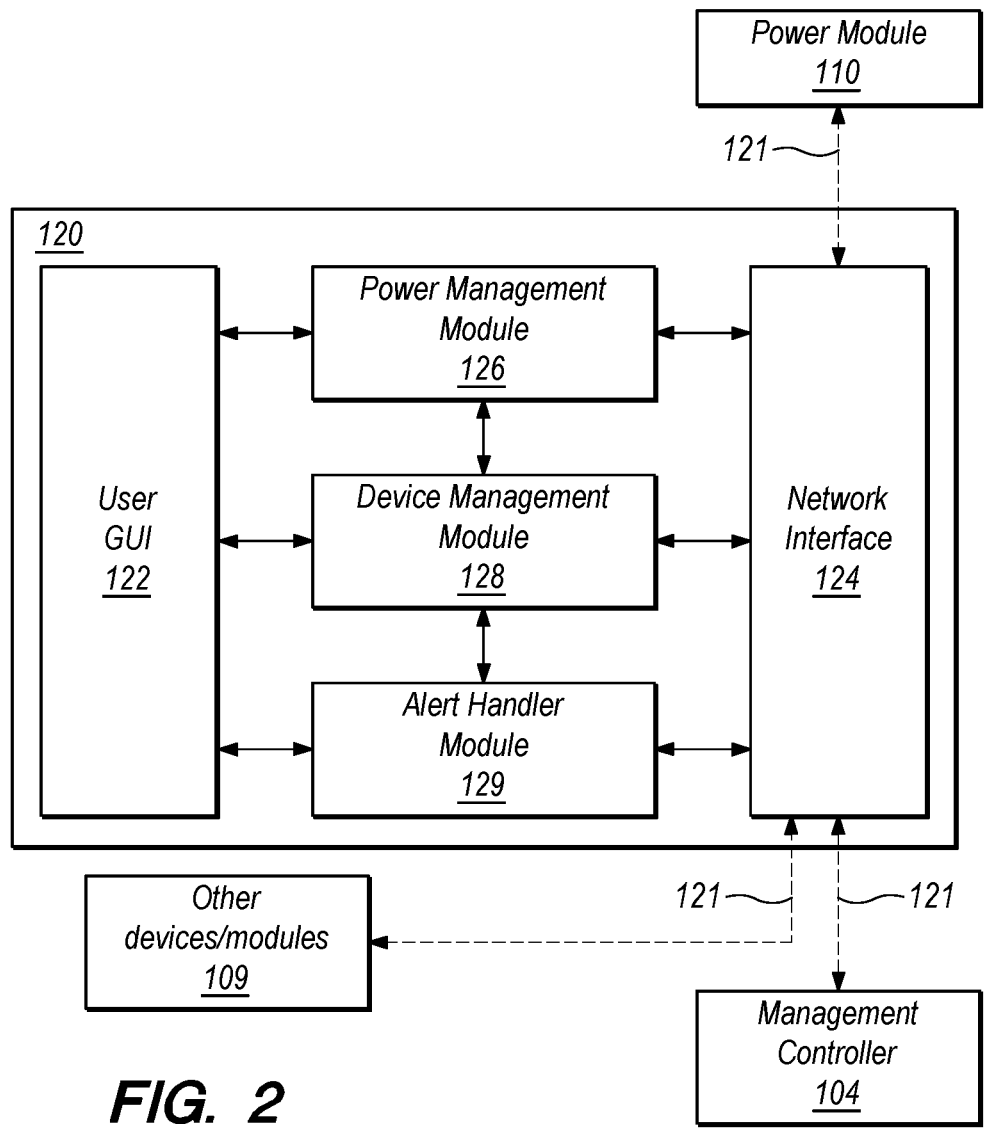
FIG. 2 is a block diagram of a management software in accordance with an embodiment.

FIG. 2 is a block diagram of the management software 120. The management software 120 includes a user Graphical User Interface (GUI) 122 and a network interface 124. The management software 120 further includes a power management module 126, a device management module 128 and an alert handler module 129, where each of the modules 126, 128, 129 are coupled to both the GUI 122 and the network interface 124. A system administrator may provide input to the GUI 122 to configure the management software 120 for power allocation to the nodes. More specifically, the system administrator may input data into GUI 122 to configure power capping to each node. The system administrator may also provide input to GUI 122 to configure a threshold number of hits which may trigger a power re-allocation method or process (i.e., power capping adjustment). The power management module 126, the device management module 128 and the alert handler module 129 operate and coordinate with each other to perform the operation of the management software 120. The network interface 124 establishes communication with the power module(s) 110, the management controller(s) 104 and other devices or modules 109 in a computer system via a private or public network 121.

For each node, the management controller 104 (e.g. a Baseboard Management Controller (BMC)) obtains real-time power usage data of the node from the power controller 108 (e.g. Node Manager) of the same node. For each node, the power controller 108 is equipped with power metering and power limiting functions (using Node Manager as an example) for the node. For each node, the management controller 104 is configured to obtain real-time power usage data of the node and store the real-time power usage data as historical power usage data of the node.

In the present embodiment, the management software 120 communicates with the management controller 104 of each node, and may obtain real-time power usage data for a node through the management controller 104. In some other embodiments, the management software 120 may directly communicate with the power controller 108 of each node to acquire real-time power usage data.

In one embodiment, the management software 120 determines a current power capping amount, level or threshold for each node, based on the historical power usage data of the node and the total available power supply capacity of the power module 110. The current power capping amount determined for each node is then allocated to each corresponding node for limiting (capping) the power usage of each node. It should be recognized that the current power capping amount may be determined to be the same amount or a different amount for each node.

After the current power capping amount is allocated to each node, the management software 120 will determine that a particular node has a high likelihood of using more power than the current power capping amount allocated to the node in response to detecting that a current power usage of the node has reached (or "hit") the current power capping amount a number of times greater than or equal to the threshold number of hits set by the administrator. Accordingly, the management software 120 will be triggered to adjust the current power capping amount (i.e., initiate power reallocation), by determining an updated power capping amount which is higher than the current power capping amount, and allocate the updated power capping amount to this node.

For one or more other nodes, where the current power usage of the particular node is less than the current power capping amount allocated to the particular node, the management software 120 determines a low possibility for such node to use more power beyond its current power capping amount. Accordingly, the management software 120 will determine an updated power capping amount which is either the same as, or lower than, the current power capping amount, and allocates the updated power capping amount to such node.

Figure 3:
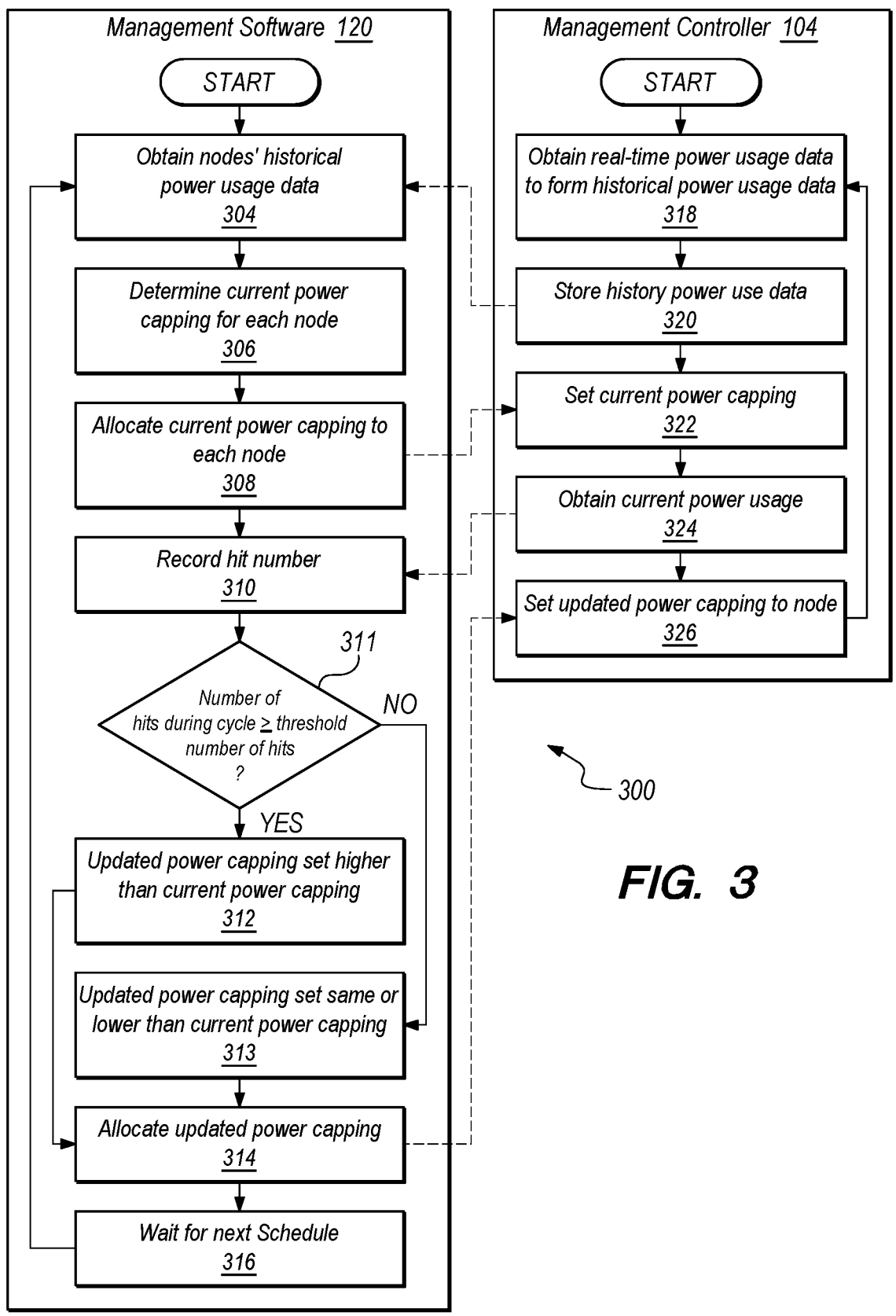
FIG. 3 is a flowchart of a method of power allocation in accordance with one embodiment.

FIG. 3 is a flowchart illustrating a power allocation method 300 for a plurality of computing devices according to one embodiment. In this and other embodiments disclosed in the context, the power allocation method is illustrated for nodes, as a non-limiting example of computing devices, in computer systems. The computing devices may be in the form of servers or similar types of loads that operate and consume power in a computer system.

At block 318, the management controller 104 of each node obtains real-time power usage data from the power controller 108 of the node. Such real-time power usage data is accumulated over a time period, to form historical power usage data of the node. At block 320, the historical power usage data of the node in a past time frame is stored in the management controller 104. The management software 120 obtains the historical power usage data of the node from the management controller 104 at block 304.

The management software 120 determines a current power capping amount for each node at block 306, based on the historical power usage data of the node and the total available power supply capacity of the power module 110. At block 308, the management software 120 allocates a current power capping amount to each of the nodes. At block 322, the management controller 104 sets the allocated current power capping amount for the node.

Subsequently, at block 324, the management controller 104 obtains the current power usage data of the node. If the current power usage of the node reaches ("hits") the current power capping amount allocated to the node, then the controller 104 reports the situation or event to the management software 120. The management software 120 will record the hit number of each node in this cycle (i.e., the number of times that the current power usage of the node reaches the current power capping amount allocated to the node during the cycle of operation) at block 310. At block 311, a criteria is assessed to determine whether the hit number for the node exceeds a predetermined threshold number of hits times. If "yes" (i.e., if the number of hits for the node during the cycle exceeds the threshold number of hits), then the method proceeds to block 312 where the updated power capping amount is determined or set to be higher than the current power capping amount. If "no" (i.e., if the number of hits for the node during the cycle does not exceed the threshold number of hits), then the method proceeds to block 313 where the updated power capping amount is determined or set to be the same as, or lower than, the current power capping amount. At block 314, the management software 120 allocates, for each node, the updated power capping amount to the corresponding node.

At block 326, the updated power capping amount is provided to the management controller 104 and set to the node. The management software 120 then proceeds to block 316 to wait for a next schedule or iteration of the power capping determination, and returns to block 304 to start a new cycle of power allocation determination operation. Meanwhile, the management controller 104 starts a new cycle of power usage acquisition for providing to the management software for power capping determination.

The current power capping amount may be calculated according to the following formula:

$$P\_allo = (P\_node\_his/P\_total) * (P\_avail - P\_min * N\_power\_off)$$

where:
P_allo denotes the current power capping amount for allocating to a node;
P_node_his denotes a power usage amount of the node in a most-recent past time frame or cycle;
P_total denotes a total power usage amount of all the nodes in the most-recent past time frame or cycle;
P_avail denotes a total available power amount of the power supply unit(s) in a current time frame;
P_min denotes a minimum amount of power that each node needs to power on; and
N_power_off denotes the number of nodes in power off state in the most-recent past time frame or cycle.

If the real-time power usage of one or more nodes reaches (or "hits") the current power capping amount and the number of times that the node hits the current power capping amount is greater than the predetermined threshold number of hits, then the management software 120 will be triggered to determine and allocate an updated power capping amount to the node(s). The updated power capping amount is denoted as P_allo_new in the context, and a predetermined step of power increment/decrement for determining the updated power capping amount on the basis of the current power capping amount to the node, is denoted as P_step.

For node(s) with current power usage that reaches (i.e., "hits") the current power capping amount in the current time frame, the updated power capping amount is determined or calculated to be higher than the current power capping amount, e.g. by a predetermined increment or step up from the current power capping amount, as represented by formula P_allo_new=P_allo+P_step. For node(s) with current power usage that is lower than (i.e., does not "hit") the current power capping amount in the current time frame, the updated power capping amount is determined or calculated to be the same as or lower than the current power capping amount, by a decrement or step down from the current power capping amount, as represented by formula P_allo_new=P_allo and P_allo_new=P_allo−P_step, respectively.

An example is given in Table 1 with sample data and calculations using the above-illustrated formulas. In this example, a blade system includes 10 nodes and 4 power supply units (PSUs). Each node includes two CPUs and 4 dual-in-line memory modules (DIMM) with a maximum total power consumption of 500 W. The label power of each PSU is 2000 W, and the fans and switches of the 4 PSUs consumes total power of 920 W. Assuming that 2 PSUs failed, the power supply capacity of the remaining PSUs is then 3080 W (The total label power of 2 PSUs minus the power consumption of fan and switches, i.e. 2000*2−920=3080 W). The nominal average power capping is 308 W for each node and the power capping amount for each node will be dynamically adjusted according to the ongoing power consumption of each node.

TABLE 1

| Node # | 1 | 2 | 3 | 4 | 5 | 6 | 7 | 8 | 9 | 10 |
|---|---|---|---|---|---|---|---|---|---|---|
| P_node_his (W) (average power in last 1 min) | 300 | 300 | 200 | 400 | 200 | 400 | 0 (off) | 200 | 0 (off) | 400 |
| P_allo (W) | 360 | 360 | 240 | 480 | 240 | 480 | 100 | 240 | 100 | 480 |
| P_allo hit number | 1 | 1 | 3 | 0 | 2 | 0 | 0 | 2 | 0 | 0 |
| P_allo_new (W) | 360 | 360 | 250 | 470 | 240 | 480 | 100 | 240 | 100 | 480 |

As shown in Table 1, the sum of the P_node_his for Node 1 to Node 10 is 2400 W, which is the total power usage (P_total) of the 10 nodes in the last time frame. The total available power (P_avail) of the power supply unit is 3080 W; the minimal power for each node to power on (P_min) is 100 W, and 2 nodes, i.e. Node 7 and Node 9, are in power off state. The allocated power (P_allo) is hence calculated according to formula set out above for P_allo and data set out above in Table 1.

Taking Node 3 and Node 4 as examples, the historical power usage of Node 3 is 200 W, and the historical power usage of Node 4 is 400 W. According to formula set out above for P_allo, the current power capping amount (P_allo) for Node 3 is calculated as 240 W, and the current power capping amount (P_allo) for Node 4 is calculated as 480 W, according to the following calculations:

$P\_allo=(200/(300+300+200+400+200+400+200+400))*(3080-100*2)=240$ W    Node 3:

$P\_allo=(400/(300+300+200+400+200+400+200+400))*(3080-100*2)=480$ W    Node 4:

The current power capping amount (P_allo) for the other nodes can be obtained in the same manner.

Assuming that the threshold number of hits has been set to 3 and that the current power usage of Node 3 is 240 W, such that Node 3 hits the power capping amount of 240 W in a consecutive 3 seconds (P_allo hit number=3), then the management software will reallocate power among the nodes. According to the method illustrated above, the management software determines an updated power capping amount for Node 3 to be higher than the current power capping amount, and allocates the updated power capping amount to Node 3 as a prediction of higher power usage by Node 3 in the next time period. Given an increment of 10 W (P_step=10 W), the updated power capping amount for Node 3 is 240 W+10 W=250 W.

Nodes 4, 6 and 10 are the only nodes that are both turned on (Nodes 7 and 9 are turned off) and have current power usage that does not hit the respective current power capping amount (P_allo hit number=0) during a current cycle of the method. Specifically, for each of the Nodes 4, 6 and 10, the current power usage of each of the Nodes 4, 6 and 10 is less than its respective current power capping amount of 480 W. The management software therefore determines that each of the Nodes 4, 6 and 10 does not have a high likelihood of using an amount of power exceeding the current power capping amount of 480 W, and determines that the power capping amount of Nodes 4, 6 and 10 may be reduced in order to reserve power capacity for nodes having the greatest number of hits (i.e., nodes that have reached their current power capping amount the most in the latest cycle). In the example given above, only one node, Node 3, hits the current power capping amount in consecutive 3 seconds (P_allo hit number=3). Therefore, an extra power of 10 W (where P_step=10 W) is to be allocated as the updated power capping amount for Node 3. Since only one Node in this Example has its power capping amount increased, only one of the Nodes 4, 6 and 10 is selected, on a random basis, in this example Node 4, to be allocated with an updated power capping amount of 470 W by the formula (480 W−10 W=470 W). The updated power capping amount of Nodes 6 and 10 may remain unchanged as 480 W.

The power allocation method may be configured to allow a system administrator to assign a priority value to each node through the GUI. In situations where the majority of the nodes have the highest number of power capping hits, for example 8 out 10 nodes have the (same) highest P_allo hit number, the nodes with a high priority value will be allocated with more power than the nodes with a lower priority value.

The power allocation method illustrated above improves the power efficiency in a total group of nodes in situations where the total amount of power available is insufficient to support running of all the nodes at full power. Nodes which have a possibility or trend of using more power will be allocated with relatively higher power capping amounts, and nodes which do not present a possibility or trend of using more power will be allocated with relatively lower power capping amounts to improve the system performance while balancing the power supply to each node in the system.

Figure 4:
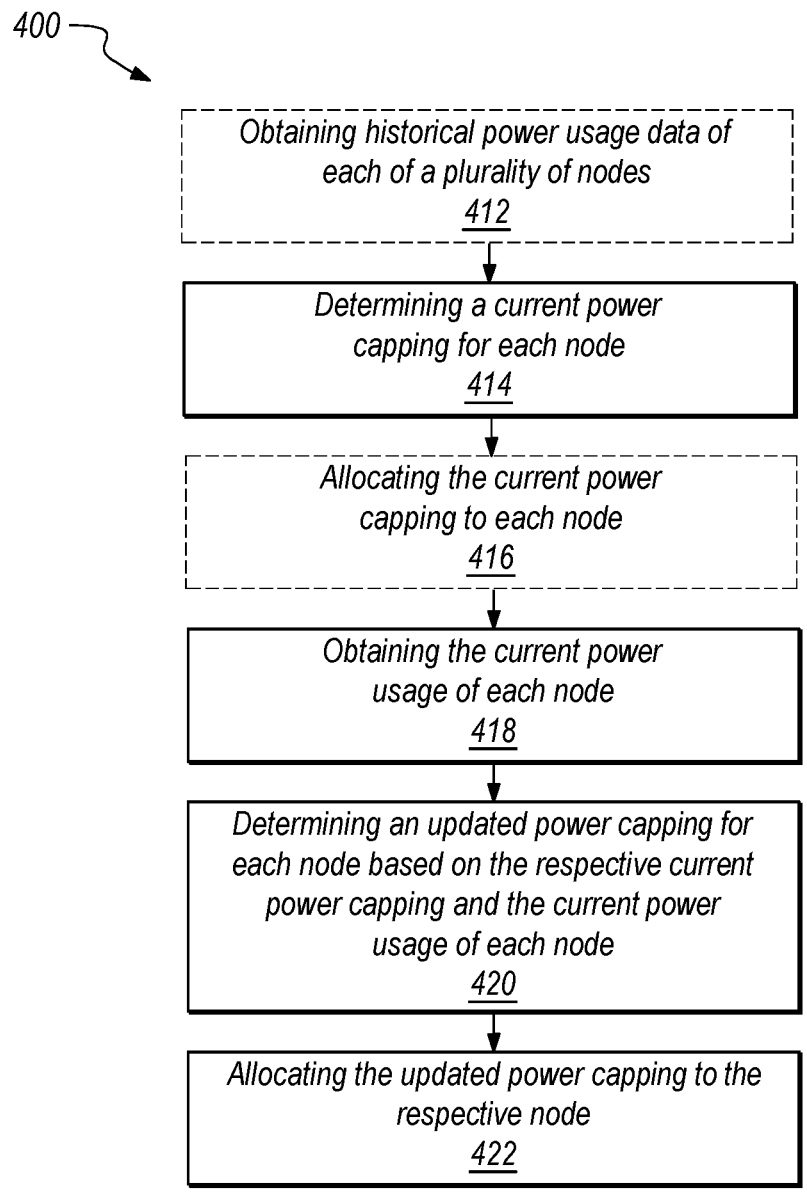
FIG. 4 is a flowchart of a method of power allocation in accordance with another embodiment.

The power allocation methods illustrated above may work independently or jointly for data center power management. According to another embodiment, as shown in FIG. 4, a power allocation method 400 includes, at block 412 as an optional step, obtaining historical power usage data of each of a plurality of nodes in a computer system. At block 414, a current power capping amount for each corresponding node is determined based on the historical power usage data of the corresponding node. The current power capping amount determined for each node is then allocated to each corresponding node, at block 416 as an optional step. Thereafter, at block 418, a current power usage of each node is obtained. At block 420, the respective current power capping amount and the current power usage form the basis on which to determine an updated power capping amount for each node. The updated power capping amount for each node may then be allocated to each corresponding node at block 422.

Figure 5:
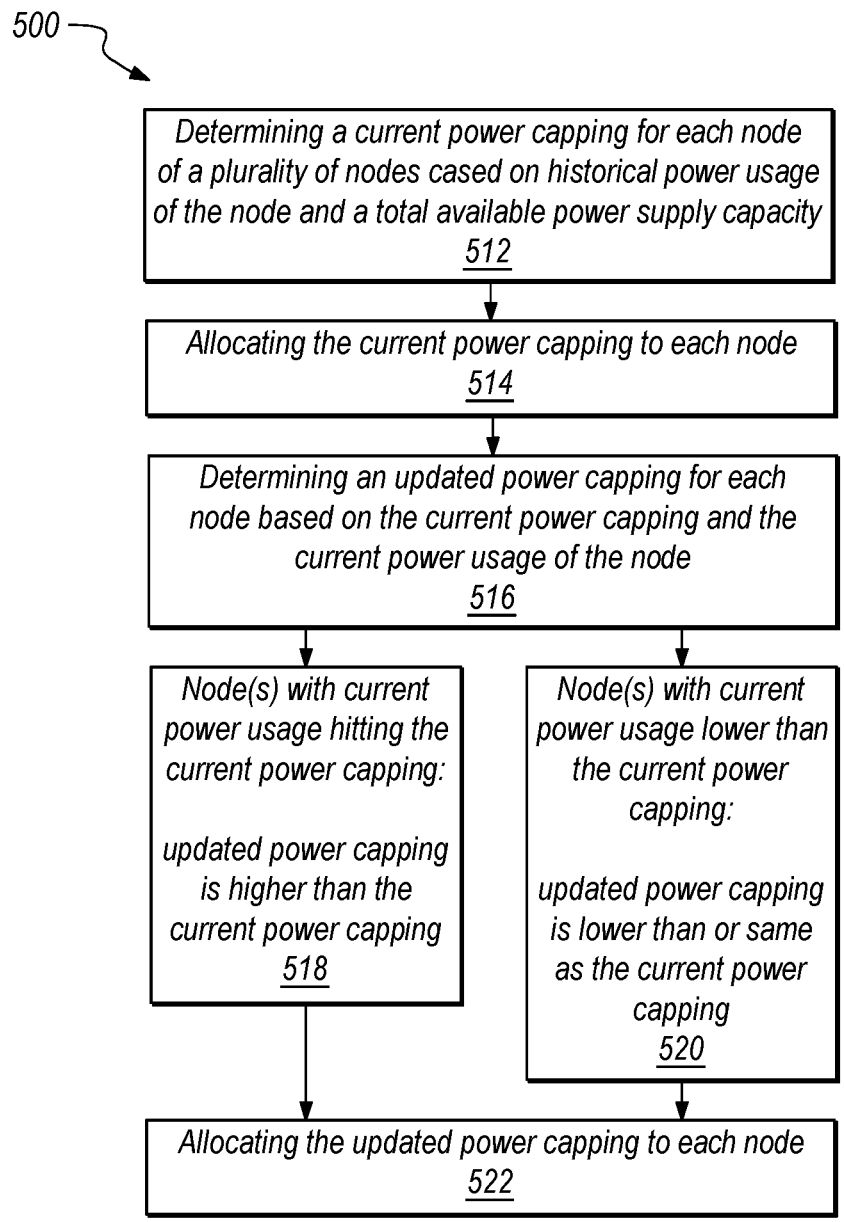
FIG. 5 is a flowchart of a method of power allocation in accordance with yet another embodiment.

In yet another embodiment as shown in FIG. 5, a power allocation method 500 includes, at block 512, determining a current power capping amount for each node of a plurality of nodes, based on a historical power usage of the node and a total available power supply capacity. At block 514, the current power capping amount determined for each node is allocated to each corresponding node. At block 516, an updated power capping amount for each node is determined based on the current power capping amount and the current power usage of the node. At block 518, for node(s) of which the current power usage hits the current power capping amount allocated to the node, the updated power capping amount will be determined or calculated (i.e., an incremental increase) to be higher than the current power capping amount. Simultaneously, immediately prior, or immediately subsequently at block 520, for node(s) of which the current power usage is the same or lower than the current power capping amount allocated to the node, the updated power capping amount will be determined or calculated (i.e., an incremental decrease) to be lower than the current power capping amount. At block 522, the determined updated power capping amount for each node is allocated to each corresponding node.

Figure 6:
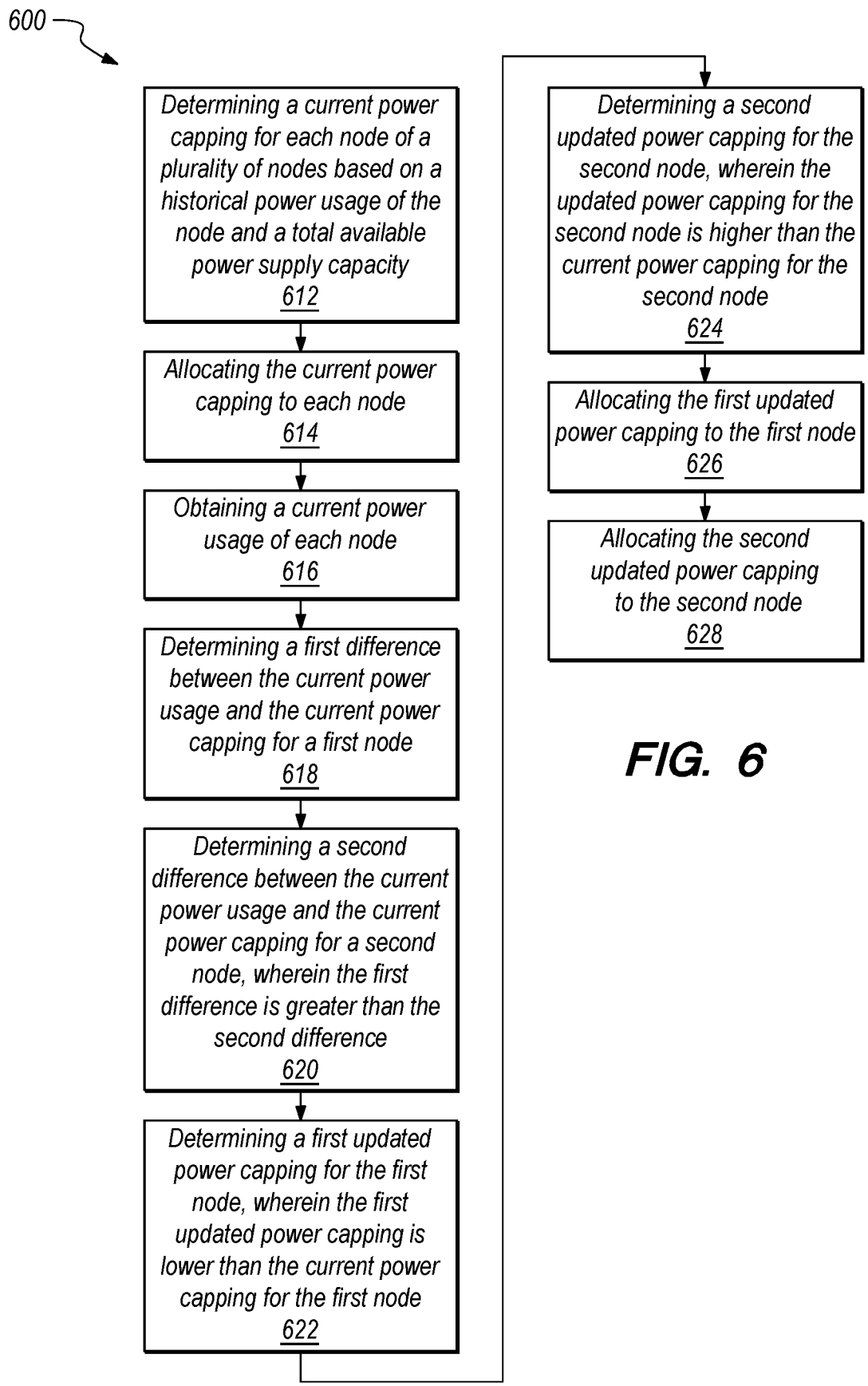
FIG. 6 is a flowchart of a method of power allocation in accordance with still another embodiment.

In still another embodiment as shown in FIG. 6, a power allocation method 600 includes, at block 612, determining a current power capping amount for each node of a plurality of nodes, based on a historical power usage of the node and a total available power supply capacity. At block 614, the current power capping amount is allocated to each node. At block 616, a current power usage of each node is obtained. At block 618, for a first node, a first difference between the current power usage and the current power capping amount is determined. At block 620, for a second node, a second difference between the current power usage and the current power capping amount is determined.

In the event that the first difference is greater than the second difference, the first node may be determined to use less power relative to its current power capping amount, as compared to the second node. In other words, the current power usage for the first node is further below its current power capping amount than is the second node. Accordingly at block 622, a first updated power capping amount for the first node is determined to be lower than the current power capping amount for the first node. Subsequently, prior to, or at the same time, at block 624, a second updated power capping amount for the second node is determined to be higher than the current power capping amount for the second node. At block 626, the first updated power capping amount is allocated to the first node, and at block 628, the second updated power capping amount is allocated to the second node.

Figure 7:
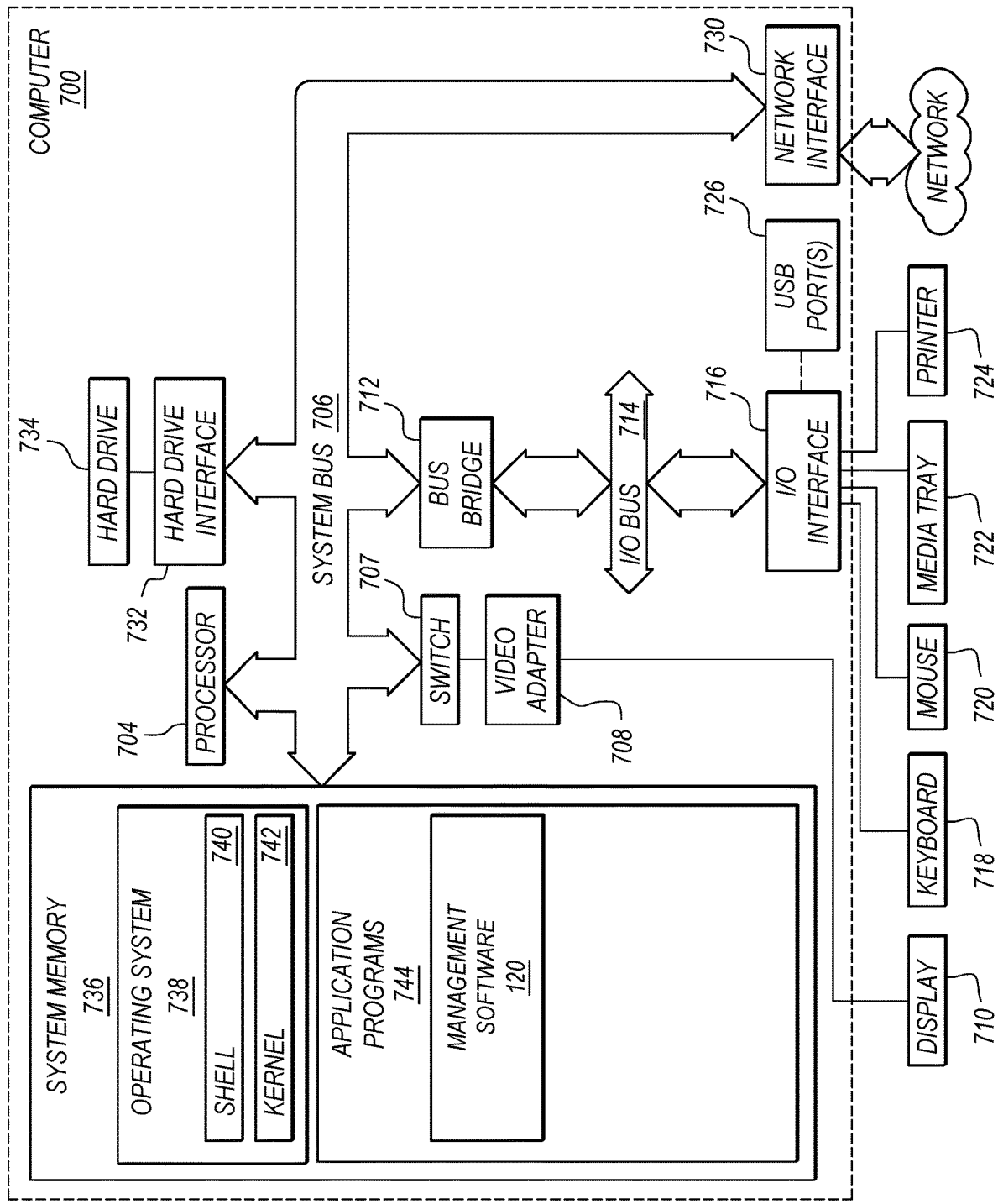
FIG. 7 is a diagram of an exemplary computer that may perform the power allocation.

FIG. 7 is a diagram of an exemplary computer 700 that may operate the management software 120. The computer 700 includes a processor unit 704 that is coupled to a system bus 706. The processor unit 704 may utilize one or more processors, each of which has one or more processor cores. A video adapter 708, which drives/supports a display 710, is also coupled to the system bus 706. In one embodiment, a switch 707 couples the video adapter 708 to the system bus 706. Alternatively, the switch 707 may couple the video adapter 708 to the display 710. In either embodiment, the switch 707 is a switch, preferably mechanical, that allows the display 710 to be coupled to the system bus 706, and thus to be functional only upon execution of instructions that support the processes described herein.

The system bus 706 is coupled via a bus bridge 712 to an input/output (I/O) bus 714, and an I/O interface 716 is coupled to I/O bus 714. The I/O interface 716 affords communication with various I/O devices, including a keyboard 718, a mouse 720, a media tray 722 (which may include storage devices such as CD-ROM drives, multimedia interfaces, etc.), a printer 724, and an external port(s) 726. While the format of the ports 726 connected to I/O interface 716 may be any known to those skilled in the art of computer architecture, in a preferred embodiment some or all of these ports are universal serial bus (USB) ports.

As depicted, the computer 700 is able to communicate over a network using a network interface 730. For example, the computer may use the network interface to communicate with the power module 110 of FIG. 1 and any of the Nodes 1-n of FIG. 1. The network 728 may be an external network such as the Internet, or an internal network such as an Ethernet or a virtual private network (VPN).

A hard drive interface 732 is also coupled to system bus 706, where the hard drive interface 732 interfaces with a hard drive 734. In a preferred embodiment, the hard drive 734 populates a system memory 736, which is also coupled to system bus 706. System memory is defined as a lowest level of volatile memory in computer 702. This volatile memory includes additional higher levels of volatile memory (not shown), including, but not limited to, cache memory, registers and buffers. Data that populates the system memory 736 may include an operating system (OS) 738 and application programs 744.

The operating system 738 includes a shell 740, for providing transparent user access to resources such as application programs 744. Generally, the shell 740 is a program that provides an interpreter and an interface between the user and the operating system. More specifically, the shell 740 executes commands that are entered into a command line user interface or from a file. Thus, the shell 740, also called a command processor, is generally the highest level of the operating system software hierarchy and serves as a command interpreter. The shell provides a system prompt, interprets commands entered by keyboard, mouse, or other user input media, and sends the interpreted command(s) to the appropriate lower levels of the operating system (e.g., a kernel 742) for processing. Note that while the shell 740 may be a text-based, line-oriented user interface, the present invention will equally well support other user interface modes, such as graphical, voice, gestural, etc.

As depicted, the OS 738 also includes a kernel 742, which includes lower levels of functionality for the OS 738, including providing essential services required by other parts of the OS 738 and the application programs 744, including memory management, process and task management, disk management, and mouse and keyboard management. The application programs 744 in the system memory of computer 700 may include the management software 120 of FIG. 1 for implementing the methods described herein.

The hardware elements depicted in computer 700 are not intended to be exhaustive, but rather are representative components suitable to perform the processes of the present invention. For instance, the computer 700 may include alternate memory storage devices such as magnetic cassettes, digital versatile disks (DVDs), Bernoulli cartridges, and the like.

This disclosure has been presented for purposes of illustration and description but is not intended to be exhaustive or limiting. Many modifications and variations will be apparent to those of ordinary skill in the art. The example embodiments were chosen and described in order to explain principles and practical applications, and to enable others having an ordinary level of skill in the art to understand the disclosure for various embodiments with various modifications as are suited to the particular use contemplated. Thus, although illustrative example embodiments have been described herein with reference to the accompanying figures, it is to be understood that this description is not limiting and that various other changes and modifications may be affected therein by one skilled in the art without departing from the scope of the disclosure. It will be readily understood that the components of the embodiments, as generally described and illustrated in the figures herein, may be arranged and designed in a wide variety of different configurations in addition to the described example embodiments. Thus, the detailed description of the example embodiments, including those represented in the figures, is not intended to limit the scope of the embodiments, as claimed, but is merely representative of example embodiments.

Reference throughout this specification to "one embodiment", "another embodiment" or "an embodiment" (or the like) means that a particular feature, structure, or characteristic described in connection with the embodiment is included in at least one embodiment. Thus, the appearance of the phrases "in one embodiment" or "in an embodiment" or the like in various places throughout this specification are not necessarily all referring to the same embodiment.

Furthermore, the described features, structures, or characteristics may be combined in any suitable manner in one or more embodiments. In the detailed description, numerous specific details are provided to give a thorough understanding of certain embodiments. One skilled in the relevant art will recognize, however, that the various embodiments can be practiced without one or more of the specific details, or with other methods, components, materials, etc. In other instances, some or all known structures, materials, or operations may not be shown or described in detail to avoid obfuscation.

As will be appreciated by one skilled in the art, embodiments may take the form of a system, method or computer program product. Accordingly, embodiments may take the form of an entirely hardware embodiment, an entirely software embodiment (including firmware, resident software, micro-code, etc.) or an embodiment combining software and hardware aspects that may all generally be referred to herein as a "circuit," "module" or "system." Furthermore, embodiments may take the form of a computer program product embodied in one or more computer readable medium(s) having computer readable program code embodied thereon.

Any combination of one or more computer readable storage medium(s) may be utilized. A computer readable storage medium may be, for example, but not limited to, an electronic, magnetic, optical, electromagnetic, infrared, or semiconductor system, apparatus, or device, or any suitable combination of the foregoing. More specific examples (a non-exhaustive list) of the computer readable storage medium would include the following: a portable computer diskette, a hard disk, a random access memory (RAM), a read-only memory (ROM), an erasable programmable read-only memory (EPROM or Flash memory), a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device. Furthermore, any program instruction or code that is embodied on such computer readable storage media (including forms referred to as volatile memory) that is not a transitory signal are, for the avoidance of doubt, considered "non-transitory".

Program code embodied on a computer readable storage medium may be transmitted using any appropriate medium, including but not limited to wireless, wireline, optical fiber cable, RF, etc., or any suitable combination of the foregoing. Computer program code for carrying out various operations may be written in any combination of one or more programming languages, including an object oriented programming language such as Java, Smalltalk, C++ or the like and conventional procedural programming languages, such as the "C" programming language or similar programming languages. The program code may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider).

Embodiments may be described with reference to flowchart illustrations and/or block diagrams of methods, apparatus (systems) and computer program products. It will be understood that each block of the flowchart illustrations and/or block diagrams, and combinations of blocks in the flowchart illustrations and/or block diagrams, can be implemented by computer program instructions. These computer program instructions may be provided to a processor of a general purpose computer, special purpose computer, and/or other programmable data processing apparatus to produce a machine, such that the instructions, which execute via the processor of the computer or other programmable data processing apparatus, create means for implementing the functions/acts specified in the flowchart and/or block diagram block or blocks.

These computer program instructions may also be stored on computer readable storage media is not a transitory signal, such that the program instructions can direct a computer, other programmable data processing apparatus, or other devices to function in a particular manner, and such that the program instructions stored in the computer readable storage medium produce an article of manufacture.

The computer program instructions may also be loaded onto a computer, other programmable data processing apparatus, or other devices to cause a series of operational steps to be performed on the computer, other programmable apparatus or other devices to produce a computer implemented process such that the instructions which execute on the computer or other programmable apparatus provide processes for implementing the functions/acts specified in the flowchart and/or block diagram block or blocks.

The flowchart and block diagrams in the Figures illustrate the architecture, functionality, and operation of possible implementations of systems, methods and computer program products. In this regard, each block in the flowchart or block diagrams may represent a module, segment, or portion of code, which comprises one or more executable instructions for implementing the specified logical function(s). It should also be noted that, in some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts, or combinations of special purpose hardware and computer instructions.

The terminology used herein is for the purpose of describing particular embodiments only and is not intended to limit the scope of the claims. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, components and/or groups, but do not preclude the presence or addition of one or more other features, integers, steps, operations, elements, components, and/or groups thereof. The terms "preferably," "preferred," "prefer," "optionally," "may," and similar terms are used to indicate that an item, condition or step being referred to is an optional (not required) feature of the embodiment.

The corresponding structures, materials, acts, and equivalents of all means or steps plus function elements in the claims below are intended to include any structure, material, or act for performing the function in combination with other claimed elements as specifically claimed. Embodiments have been presented for purposes of illustration and description, but it is not intended to be exhaustive or limited to the embodiments in the form disclosed. Many modifications and variations will be apparent to those of ordinary skill in the art after reading this disclosure. The disclosed embodiments were chosen and described as non-limiting examples to enable others of ordinary skill in the art to understand these embodiments and other embodiments involving modifications suited to a particular implementation.

What is claimed is:

1. A computer program product comprising computer readable storage media that is not a transitory signal having program instructions embodied therewith, the program instructions executable by a processor to:

determine a current power capping amount for each of a plurality of computing devices, wherein the plurality of computing devices includes a first computing device and a second computing device;

obtain a current power usage of each computing device;

determine, for each computing device, an updated power capping amount based on whether or not the current power usage of the computing device has reached the current power capping amount of the computing device during a current period of time, wherein determining, for each computing device, an updated power capping amount comprises:

determining, for the first computing device, a first difference between the current power usage of the first computing device and the current power capping amount of the first computing device; and determining, for a second computing device, a second difference between the current power usage of the second computing device and the current power capping amount for the second computing device, wherein, in response to the first difference being greater than the second difference, the updated power capping amount for the first computing device is determined to be lower than the current power capping amount for the first computing device and the updated power capping amount for the second computing device is determined to be higher than the current power capping amount for the second computing device;

allocate the updated power capping amount to the respective computing devices; and cause a power supply to deliver power to each computing device in an amount up to the updated power capping amount that has been allocated to the respective computing device.

2. A computer program product comprising computer readable storage media that is not a transitory signal having program instructions embodied therewith, the program instructions executable by a processor to:

determine a current power capping amount for each of a plurality of computing devices;

obtain a current power usage of each computing device;

determine, for each computing device, an updated power capping amount based on whether or not the current power usage of the computing device has reached the current power capping amount of the computing device during a current period of time, wherein, for each computing device having a current power usage that hit the current power capping amount the greatest number of times among the plurality of computing device during the current time period, the updated power capping amount is determined to be an incremental increase above the current power capping amount of the computing device;

allocate the updated power capping amount to the respective computing devices; and cause a power supply to deliver power to each computing device in an amount up to the updated power capping amount that has been allocated to the respective computing device.

3. The computer program product of claim 2, wherein the program instructions executable by a processor to determine, for each computing device, an updated power capping amount, include program instructions executable by the processor to:

determine a number of the computing devices having an updated power capping amount that is being incrementally increased;

identify an equal number of other computing devices having a current power usage that has not hit the current power capping amount during the current time period; and determine, for each of the identified computing devices, an updated power capping amount that is a predetermined incremental decrease below the current power capping amount of the identified computing device.

4. A computer program product comprising computer readable storage media that is not a transitory signal having program instructions embodied therewith, the program instructions executable by a processor to:

determine a current power capping amount for each of a plurality of computing devices;

obtain a current power usage of each computing device;

determine, for each computing device, an updated power capping amount based on whether or not the current power usage of the computing device has reached the current power capping amount of the computing device during a current period of time;

allocate the updated power capping amount to the respective computing devices; and cause a power supply to deliver power to each computing device in an amount up to the updated power capping amount that has been allocated to the respective computing device, wherein the updated power capping amount for each of the plurality of computing devices is calculated according to the formula:

$$P\_allo=(P\_node\_his/P\_total)*(P\_avail-P\_min*N\_power\_off)$$

where:

P_allo denotes the current power capping amount for allocating to a computing device;

P_node_his denotes a power usage amount of the computing device in a most-recent past time frame or cycle;

P_total denotes a total power usage amount of all of the computing devices in the most-recent past time frame or cycle;

P_avail denotes a total available power amount of the power supply unit(s) in a current time frame;

P_min denotes a minimum amount of power that each computing device needs to power on; and N_power_off denotes the number of computing devices in a power off state in the most-recent past time frame or cycle.

* * * * *